United States Patent [19]

Venkataraman et al.

[11] Patent Number: 4,862,493
[45] Date of Patent: Aug. 29, 1989

[54] ELECTRONIC REMOTE DATA RECORDER FOR ELECTRIC ENERGY METERING

[75] Inventors: Krishnan Venkataraman, Dover; Richard A. Balch, Rochester, both of N.H.

[73] Assignee: General Electric Company

[21] Appl. No.: 119,790

[22] Filed: Dec. 28, 1987

[51] Int. Cl.⁴ .............................. H04M 11/00
[52] U.S. Cl. .................... 379/107; 364/900; 364/948.5; 364/920; 364/925.2; 340/870.02
[58] Field of Search .............. 379/106, 107, 42; 364/200, 900; 340/870.02, 870.03; 324/113, 142, 157; 365/228

[56] References Cited

U.S. PATENT DOCUMENTS

| | | | |
|---|---|---|---|
| 4,335,447 | 6/1982 | Jerrim | 364/900 |
| 4,400,783 | 8/1983 | Locke, Jr. et al. | 364/900 |
| 4,573,141 | 2/1986 | Simon | 364/900 |

*Primary Examiner*—Jin F. Ng
*Assistant Examiner*—Bonita Lewis
*Attorney, Agent, or Firm*—Thomas R. Morrison

[57] ABSTRACT

An electronic remote data recorder records pulses representing usage of a commodity such as, for example, water, gas or electricity from a plurality of consumers. The data from each consumer is stored in a respective data storage device. Each data storage device is associated with an interval data directory which stores the times at which significant events, affecting the data in the data storage device occurred. Thus, the data in the data storage device is compact, without requiring a contemporaneous time code for each data item. Data integrity is retained over a period of power outage in a non-volatile storage device. Initial, post-installation programming is enabled by comparing the data pattern in the non-volatile storage device with a predefined data pattern that is expected to exist once the apparatus has been programmed. A write-protect switch prevents programming during an incoming call after the initial programming. Programming from an external source may be permitted during a telephone call initiated by the data recorder itself. A telephone line-sharing device permits a plurality of remote data recorders to share a single telephone line without interfering with each other.

5 Claims, 10 Drawing Sheets

ELECTRONIC REMOTE DATA RECORDER FOR ELECTRIC ENERGY METERING

BACKGROUND OF THE INVENTION

The present invention relates to data recorders and, more particularly, to digital data recorders adapted for remote access over dial-up telephone lines.

Since the earliest days of utilities providing energy in the form of gas and electricity, the consumption of energy has been metered at the user's location. Collecting the metered data has been done traditionally by a meter reader visiting the user's consumer's location at regular intervals to note the indication on an indicator such as, for example, dials or drums on an electromechanical register or an electronic display or digital readout. In one series of electric meters produced by the General Electric Company, readout accuracy and speed are enhanced by an optical readout device accessing the data through an optical port provided under the trademark Optocom.

The cost of electric energy is generally considered to consist of two parts: out-of-pocket costs and capital costs.

Out-of-pocket costs are those required for the generation and distribution of the electric energy. Such costs are fairly recovered by a charge based on the actual consumption of energy.

Capital costs are those that the utility must bear to be prepared to supply the total electricity needs of all of its consumers. It is well known that the consumption of electricity has diurnal, as well as seasonal, patterns. In hot summer weather, for example, it is well known that peak consumption is reached in some systems in the late afternoon as consumers return home and turn on their air conditioners. In winter, similar peaks arise from lighting loads synchronized by early darkness causing business and residential consumers to turn on lighting fixtures at about the same time. Business and industrial consumers produce consumption peaks from motor start-up loads and the energy consumption of air conditioning, lighting and other business and industrial uses.

The size and cost of a plant for generating and distributing electricity are determined by the peak load the plant must accommodate. Thus, the capital cost of building a generation and distribution facility is similarly governed by the peak load, rather than the average load.

Demand metering is concerned with the magnitudes of consumption peaks rather than with the times they occur. Conventional demand meters accumulate the amount of energy usage in each of a continuous sequence of demand intervals. At the end of each demand interval, the energy consumption in the interval is compared to a stored value representing the maximum demand in all previous demand intervals in a current period. If the demand in the just-ended demand interval exceeds the demand in the previous demand interval having highest demand, a new highest-demand is stored and the previous high demand is erased. When read out, the maximum demand is used to influence the rate at which the consumer's total electric energy consumption is billed for a period which may extend for a period as long as a year or more.

The familiar electric meter for residential consumers contains a mechanical register accumulating total energy usage in units of, for example, kilowatt hours. No distinction is made for the time during which the consumption occurs or for peaks in energy consumption, as in time-of-use and demand systems. The times (of day, week and year) during which consumption occurs is critical to time-of-use or demand metering.

Electronic demand and time-of-use register generally mimic the functions of their mechanical predecessors. Most electronic registers add display and analysis features not easily implemented in mechanical registers, but not of interest to the present invention.

Physical reading of registers in electric meters is a substantial burden on the utility providing the electric energy. It is thus desirable to provide means for the utility to read the consumption and time-dependent time-of-use and/or demand data from user's registers without requiring a personal visit by a meter reader.

One way to provide remote reading of a register includes a dedicated line such as, for example, a dedicated telephone line between a metering data center and a register in a consumer's facility. The metering data center is thereby enabled to query the condition of registers in the consumer's facility at will. From a practical standpoint, an energy consumer, absent a metering failure, requires a readout only at intervals of, for example, once a week or once a month. It is unlikely that a utility is cost justified in interrogating the registers of even a large energy consumer more frequently than once a day. Thus, the relatively high cost of a dedicated telephone line is difficult to justify, even in the case of a large energy consumer.

Another way to provide remote reading includes the use of a dial-up telephone line with an auto-dial, auto-answer MODEM (modulator-demodulator) at the user's location. The amount of data that must be transmitted at any time between a metering data center and an energy user fits well with the data transmission rates of which commercial MODEM devices are capable.

It is preferred that a data-communications system used with the present invention be able to share telephone facilities with other uses such as, for example, normal incoming or outgoing voice communication. Such sharing requires that the system be able to recognize that the telephone line is in use, and to delay demanding use of the telephone line until it is free. It is further desirable that means be provided to permit the data-communications system to be accessed by an incoming call. Such means may include, for example, an auto-answer function in which the system engages the incoming line after a predetermined number of rings have elapsed.

Whenever incoming telephone calls may access a data-communications system, the subject of data security arises. It is not wise, in a revenue-intensive system such as a metering data communications system, to permit unauthorized access to the data and, perhaps more importantly, it is crucial to prevent unauthorized tampering with the data or operating system. One method for avoiding unauthorized access to a data system includes the requirement that access to data requires input of a password. In the absence of the required password, access is denied. A password can consist of any combination of alphanumeric and punctuation characters receivable by a MODEM.

A further access-security method includes callback control, wherein access to the system requires that an incoming call begin with a predetermined user code, equivalent to a password, be transmitted by the station calling in. The data communications system then hangs up. If it received a correct user code, it calls a telephone number associated with the user code. Only then is communication established. Thus, in order to establish communications, an incoming caller must have the correct user code and access to the particular telephone dialed in response to the user code.

Numerous other security techniques including, for example, encryption, are well known to those skilled in the art and thus do not require further description.

Best advantage can be taken of access through a dial-up telephone line if the line can be used for other purposes when not needed by the data communications system. For example, the data communications system may be connected in parallel with the user's existing telephone line. Except for a few relatively short periods when the data communications system is in the process of communicating data with the metering data center, the user's line is undisturbed by the presence of the data communications system. Steps must be taken to prevent the data communications system from interfering with other uses and to prevent other uses from corrupting the transmitted data.

Besides a data-communications system, an electronic remote data recorder requires holding and recovery techniques to survive an intentional or unintentional power outage. Holding may be performed with battery backup for the most critical components and data. Recovery requires that recording resume without losing revenue data and with time-dependent functions updated according to actual clock time, regardless of the conditions that prevailed when the power loss occurred. In addition, means for programming the functions of the electronic remote data recorder, preferably over a telephone line, are desirable. An ability to reprogram remotely suggests that special security measure be provided to avoid unauthorized tampering with this function.

OBJECTS AND SUMMARY OF THE INVENTION

It is an object of the invention to provide an electronic remote data recorder which overcomes the drawbacks of the prior art.

It is a further object of the invention to provide an electronic remote data recorder having means for holding data during a power outage and for recovering after power resumption.

It is a still further object of the invention to provide an electronic remote data recorder having means for permitting telephone line sharing with other uses.

It is a still further object of the invention to provide an electronic remote data recorder having means for freezing changeable data during data transmission.

It is a still further object of the invention to provide an electronic remote data recorder having programmable write protection.

It is a still further object of the invention to provide an electronic remote data recorder having means for detecting a telephone line condition indicating that the telephone line is in use.

It is a still further object of the invention to provide an electronic remote data recorder having means for initializing programmable output switch conditions according to an internal clock time.

It is a still further object of the invention to provide an electronic remote data recorder having simplified means for storing interval demand data and for tracking a load profile through a programming change or a time reset.

Briefly stated, the present invention provides an electronic remote data recorder which records pulses representing usage of a commodity such as, for example, water, gas or electricity from a plurality of consumers. The data from each consumer is stored in a respective data storage device. Each data storage device is associated with an interval data directory which stores the times at which significant events, affecting the data in the data storage device occurred. Thus, the data in the data storage device is compact, without requiring a contemporaneous time code for each data item. Data integrity is retained over a period of power outage in a non-volatile storage device. Initial, post-installation programming is enabled by comparing the data pattern in the non-volatile storage device with a predefined data pattern that is expected to exist once the apparatus has been programmed. A write-protect switch prevents programming during an incoming call after the initial programming. Programming from an external source may be permitted during a telephone call initiated by the data recorder itself. A telephone line-sharing device permits a plurality of remote data recorders to share a single telephone line without interfering with each other.

According to an embodiment of the invention, there is provided a power fail detector and recovery apparatus for an electronic remote data recorder, the electronic remote data recorder including a processor therein, comprising: means for producing a power failure signal in response to a first predetermined voltage reduction in a power source to the electronic remote data recorder, the electronic remote data recorder being responsive to the power fail signal by halting operation of the processor, a non-volatile storage device for storing contents of the processor in the non-volatile storage upon occurrence of the power fail signal, means for restoring operation of the processor upon a second predetermined voltage increase in the power source above the first predetermined voltage, the means for restoring including means for comparing a pattern of the contents in the non-volatile storage with a predetermined data pattern indicating a programmed electronic remote data recorder, and for producing an enable signal when a pattern of the contents indicates that the processor has not been previously programmed, and means responsive to the enable signal for connecting programming data from an external source to the processor for initial programming thereof.

According to a feature of the invention, there is provided a data recording channel for an electronic remote data recorder comprising: a data memory, means for storing pulse data in the data memory, a data directory, means for storing in the data directory time and event-type data related to the pulse data in the data directory memory, and the time and event-type data being related to the stored pulse data to permit after-the-fact reconstruction of time information in the data memory.

According to a further feature of the invention, there is provided a data recording channel for an electronic remote data recorder comprising: a data memory, means for storing pulse data in the data memory, a first-in-first-out register, the pulse data passing through the first-in- first-out register before being stored in the data memory, and means responsive to data communication in progress for storing incoming data in the firstin-first-out register, whereby stationary data is transmitted during the data communication.

According to a still further feature of the invention, there is provided an electronic remote data recorder for recording data in a using facility, the using facility including at least one function controlled by at least one programmable switch responsive to signals from the electronic remote data recorder, comprising: means for controlling the at least one programmable switch in response to a clock, a programmable switch library including a relationship of a condition of the at least one programmable switch and at least one time, and means responsive to power restoration following a power outage for controlling the at least one programmable switch according to a content of the programmable switch library.

According to a still further feature of the invention, there is provided apparatus for sharing a single telephone line among at least first and second MODEMs, comprising: the first MODEM including a first line sharing circuit associated therewith, the second MODEM including a second line sharing circuit associated therewith, the first and second line-sharing circuits simultaneously monitoring the same telephone line, the first line-sharing circuit being a master, the second line-sharing circuit being a slave, means in the first line-sharing circuit for responding to an incoming call on a telephone line with an answer signal, means in the second line-sharing circuits for recognizing a first unique identity code and for producing an answer signal in response thereto, the first line-sharing circuit including means for recognizing the first unique identity code and for extinguishing its answer signal in response thereto, whereby control of communications is transferred to the second MODEM, means in the first line-sharing circuits for recognizing a second unique identity code and for producing an answer signal in response thereto, and the second line-sharing circuit including means for recognizing the second unique identity code and for extinguishing its answer signal in response thereto, whereby control of communications is transferred to the first MODEM.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 6 is a block diagram of a communications control circuit of FIG. 2.

DETAILED DESCRIPTION OF THE PREFERRED EMBODIMENT

Figure 1:
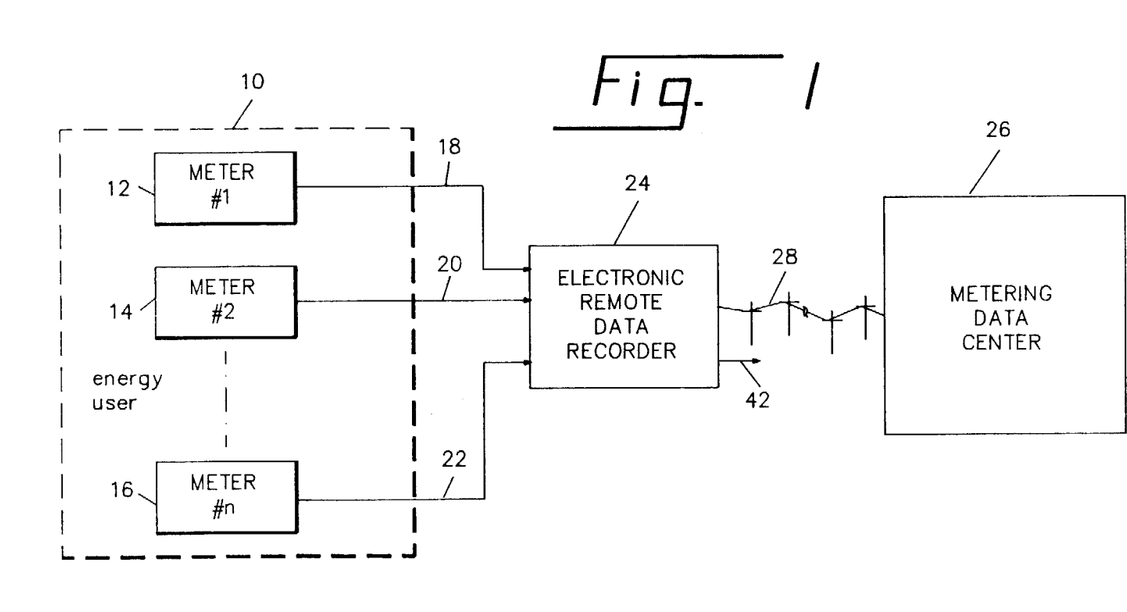
FIG. 1 is a simplified global block diagram of an energy-using facility whose data is stored and communicated to a metering data center by an electronic remote data recorder according to an embodiment of the invention.

Referring to FIG. 1, an electric energy consumer 10 which may be, for example, a business, residential or manufacturing establishment. Electric energy consumer 10 includes electricity-consuming equipment (not shown) whose energy consumption is measured by one or more kilowatthour meters 12, 14 and 16. As represented by the vertical dashed line between kilowatthour meters 14 and 16, electric energy consumer 10 may contain any required number of kilowatthour meters.

One skilled in the art will recognize that metering of energy consumption may take other forms besides kilowatthour metering. For example, some utility systems may be interested in measuring kilovoltampere hours instead of, or in addition to, kilowatthours. In addition, a large installation is frequently metered on a time-of-use and/or demand basis. Thus, instead of kilowatthour meters 12, 14 and 16 metering energy consumption from different loads, they may all be applied to metering different aspects of energy consumption of a single load. For example, if kilowatthour meter 14 is changed from a kilowatthour meter to a kilovoltampere hour meter monitoring the same load as kilowatthour meter 12, then both the real and reactive components of the load are monitored. Further, if kilowatthour meter 14 is changed from a kilowatthour meter to a kilowatthour demand or kilovoltampere hour demand meter, three different aspects of the load consumption are measured.

It is conventional in electric energy metering to produce output pulses, each of which memorializes the consumption of a predetermined quantum of the aspect of electric energy being metered. The pulses conventionally consist of switch closures of, for example, a mercury-wetted relay, solid state relay, or optical sensor. The output pulses are connected from kilowatthour meters 12, 14 and 16 on lines 18, 20 and 22, respectively, to an electronic remote data recorder 24.

Data is communicated between electronic remote data recorder 24 and a metering data center 26 on a telephone line 28.

Figure 2:
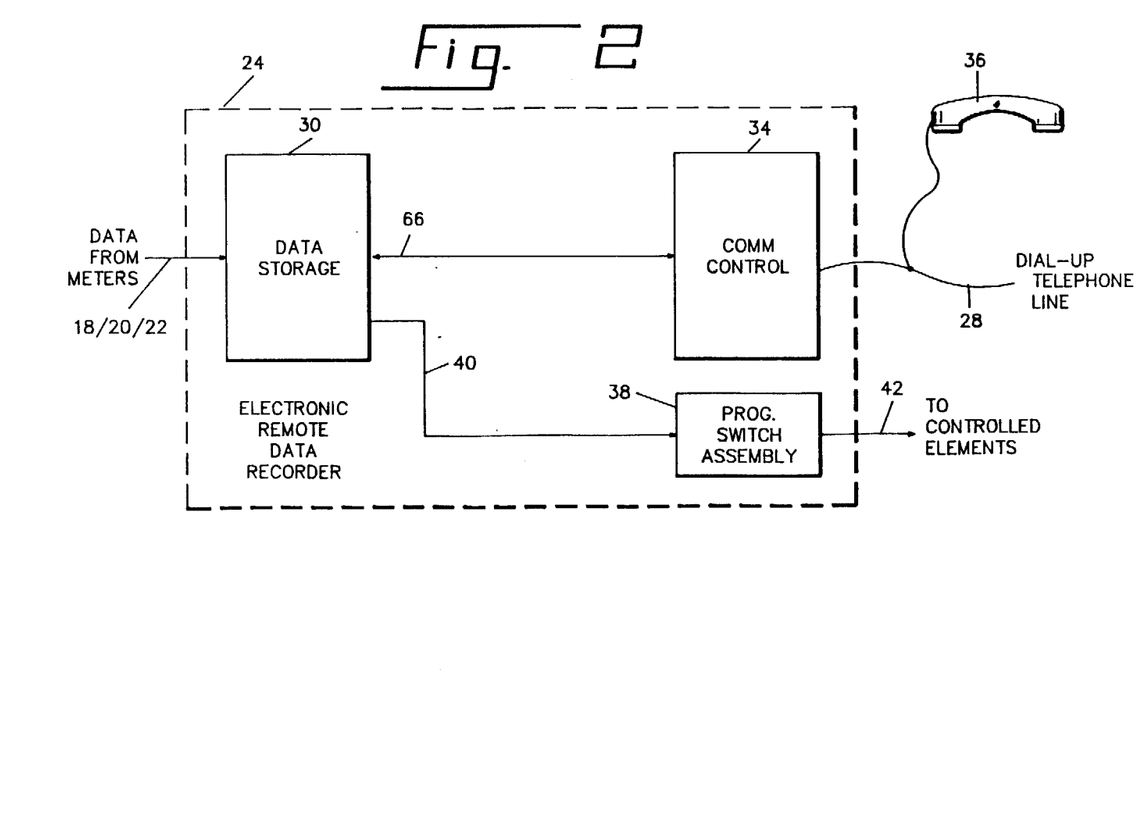
FIG. 2 is a simplified block diagram of the electronic remote data recorder of FIG. 1.

Referring now to FIG. 2, electronic remote data recorder 24 contains a data storage device 30 and a communications control unit 34. Data storage device 30 receives and stores data pulses incoming on lines 18, 20 and 22. In addition to data pulses, storage of time-dependent data such as, for example, data from which demand or time-of-use is to be reconstructed, may also be accompanied by data indicating the times at which the time-dependent data is produced. For economy, a conventional telephone instrument 36 may share use of telephone line 28 with electronic remote data recorder 24.

The data in data storage device 30 is updated each time a data pulse is received. If a period during which data is read out of data storage device 30 encompasses a time when an input pulse is received by data storage device 30, an ambiguity may result in the data sent out on telephone line 28. Data storage device 30 includes means for preventing such ambiguity by freezing a snapshot of the data in data storage device 30 at the instant that data communications begins. Thus, an internally consistent set of data is available for transmission to metering data center 26. New data pulses occurring during a transmission are not discarded; completion of their entry into data storage device 30 is merely delayed until the end of transmission. Then, they are added to the data, whereby they are available for transmission at the next readout.

Communications control unit 34 performs the functions required to permit access to the stored data in data storage device 30 and those required to prevent conflict in shared use of telephone line 28 with telephone instrument 36. These functions include a MODEM (modulator-demodulator) for converting serial binary (on-off) data to tone data suitable for transmission on telephone line 28, off-hook detection by a user of telephone instrument 36 and data security. Besides these functions, communications control unit 34 may be programmed to initiate a call to metering data center 26 under certain circumstances. Such circumstances may include, for example, the occurrence of a power outage and restoration, detected probability of data corruption or scheduled routine data transmissions. Also, communications control unit 34 may be enabled to receive and answer a call initiated by metering data center 26, whereby special interrogation, troubleshooting or programming may be performed without requiring an on-site visit.

An optional programmable switch assembly 38 is provided for controlling external functions of a using facility such as, for example, lighting, blowers, air conditioners or heating plants. In one embodiment of the invention, programmable switch assembly 38 contains a plurality of switches controlled according to time of day to control the above functions in an energy-management system for automatic control and for reducing peak loads. Programmable switch assembly 38 receives time information on a line 40. The outputs of programmable switch assembly 38 are connected on a line 42 to the controlled elements, the exact identification of which are unimportant to the present disclosure.

Figure 3:
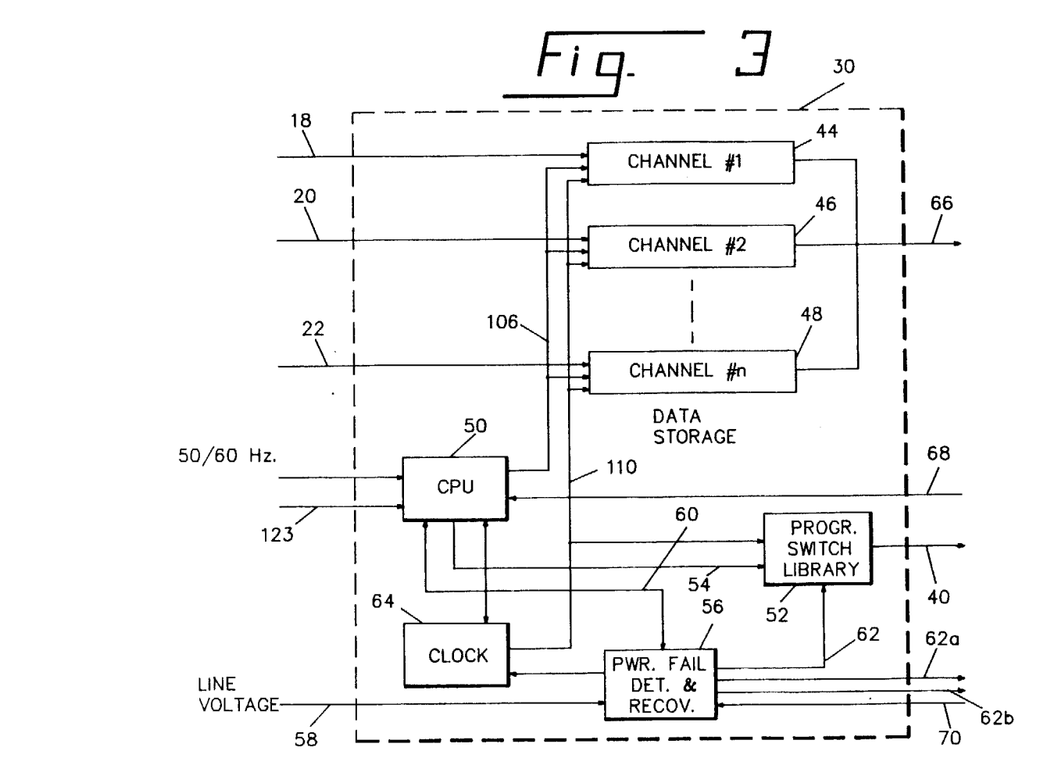
FIG. 3 is a block diagram of a data storage device of FIG. 2.

Referring now to FIG. 3, data storage device 30 includes a plurality of data storage channels 44, 46 and 48 for receiving and storing pulse data from lines 18, 20 and 22, respectively. Data storage device 30, as well as the remainder of electronic remote data recorder 24, operates under control of a central processing unit 0 which may be, for example, a suitably programmed microprocessor. Central processing unit 50 receives a signal on a line 123 indicating that a telephone has gone off line in the consumer's facility. In response to this information, central processing unit 50 may produce a signal requiring that its MODEM (not shown in FIG. 3) go off line to permit access to the telephone line by another user. In addition, central processing unit receives a sample of an AC line voltage for use in its internal timing functions.

A programmable switch library 52 contains information governing control of programmable switch assembly 38 according to time. The data in programmable switch library 52 may be changed by control signals on a line 54 from central processing unit 50.

A power fail detection and recovery unit 56 receives a sample of the AC line voltage available to electric energy consumer 10 on a line 58. In the event that a voltage condition is detected which threatens valid processing of data, power fail detection and recovery unit 56 produces a number of signals for application on lines 60 and 62 which bring processing to a halt in processor 50 before even further lowering of line voltage can produce data corruption. Power fail detection and recovery unit 56 also detects a voltage condition indicating restoration of power. The signals on lines 60 and 62 enable resumption of normal operation with due regard for tagging the data in data storage channels 44, 46 and 48 with indications of the power outage, in order to permit resumption of the accumulation of pulse data inputs. Lines 62a and 62b communicate the condition of the line voltage to other elements in electronic remote data recorder 24, as will be seen in the following.

All time-dependent functions in data storage device 30, as well as elsewhere in electronic remote data recorder 24, are controlled according to a master timing signal produced by a system clock 64. System clock 64 is preferably backed up by a long-life battery (not shown) to permit it to maintain synchronism with real time even when electronic remote data recorder 24 experiences a prolonged period out of service due, for example, to a lengthy power outage. System clock 64 receives a control signal from central processing unit 50 as well as a power fail signal fed back from power fail detection and recovery unit 56.

Central processing unit 50 receives a signal on a line 123 indicating that a second telephone has gone off hook while electronic remote data recorder 24 is engaged in communications In response to this signal, central processing unit produces a signal effective for placing electronic remote data recorder 24 on hook, thereby enabling another user in the facility to use the telephone.

Data is read out from data storage channels 44, 46 and 48 under control of signals from central processing unit 50, onto an output data line 66. Data is connected to central processing unit 50 on a data line 68. Programming data for central processing unit 50 is first connected on a programming data line 70 to power fail detection and recovery unit 56 which examines whether or not central processing unit 50 previously has been programmed. If central processing unit 50 is in an unprogrammed condition, indicating that initial programming should be permitted, or if other required conditions are satisfied, the program data is connected from power fail detection and recovery unit 56 to central processing unit 50 on line 60. If central processing unit 50 has been previously programmed, as indicated by the pattern of data therein, the condition of a write-protect switch in power fail detection and recovery unit 56, as well as other considerations, determines whether or not programming data is connected to central processing unit 50.

Under most circumstances, it is not desirable to permit programming of central processing unit 50 in response to an incoming telephone call. Even with password control, the danger of illegal entry to such a revenue-sensitive system makes such a prohibition a good choice. However, the need does exist for reprogramming to permit, for example, resetting system clock 64 and for accommodating changes in tariffs. One technique permits reprogramming on a secure basis only during data communication initiated by electronic remote data recorder 24 to metering data center 26 (FIG. 1). That is, at predetermined times, or in response to specific events such as, for example, a malfunction or power outage, an auto-dial MODEM (not shown) in electronic remote data recorder 24 is enabled by central processing unit 50 to dial the telephone number of metering data center 26. When such a communication is in progress, central processing unit 50 provides an enable signal on line 60 to power fail detection and recovery unit 56 bypassing the write-protect switch. After an automatic exchange of passwords, electronic remote data recorder 24 is enabled to communicate a trouble, or other message, to metering data center 26 and, while still connected, metering data center 26 is enabled to supply reprogramming data through power fail detection and recovery unit 56 to central processing unit 50.

Figure 4:
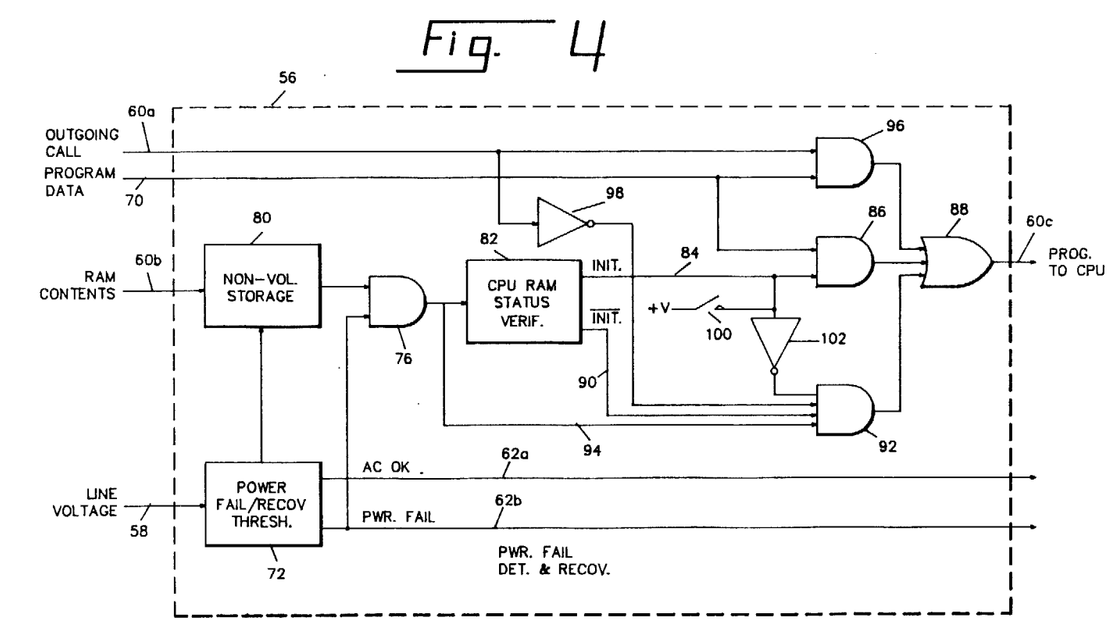
FIG. 4 is a logic diagram of a power fail and recovery circuit of FIG. 3.

Referring now to FIG. 4, a power fail/recovery threshold 72 receives the sample of the line voltage from line 58. The term "sample of the line voltage" is intended to mean a voltage whose amplitude is related arithmetically to the actual AC line voltage available to electric energy consumer 10. Such a sample may be the line voltage itself or the output voltage of the secondary winding of a transformer whose primary winding receives the line voltage. Although the particular voltages at which certain events take place are governed by the amplitude of the original line voltage, for concreteness, it is herein assumed that the nominal value of the line voltage on line 58 is 115 volts RMS.

Power fail/recovery threshold 72 produces two output signals, an AC OK signal on AC OK line 62a and a power fail signal on a power fail line 62b. When the line voltage is in a normal range exceeding about 80 volts RMS, the power fail signal on power fail line 62b enables central processing unit 50 to continue collection of energy usage data. When the AC voltage drops below 80 volts RMS, the power fail signal applied to central processing unit 50 causes it to inhibit further collection of energy usage data. All data necessary for permitting electronic remote data recorder 24 to resume operation without loss of previously recorded data is contained in non-volatile storage 80. If the line voltage continues to drop below about 50 volts, the signal on AC OK line 62a causes central processing unit 50 to go into a sleep mode in which power is shut off to all components.

After a power shutoff, when the line voltage increases beyond about 75 volts, the AC OK signal on AC OK line 62a enables central processing unit 50 to command reconnection of power to all devices in electronic remote data recorder 24, but operation of electronic remote data recorder 24 remains inhibited until the power-fail signal on power fail line 62b returns to an enabling condition at about 92 volts RMS. The hysteresis between the voltage levels for removal and restoration of the power fail and AC OK signals prevents dithering.

The circuits in power fail/recovery threshold 72 are conventional threshold, gate and multivibrator devices with which everyone skilled in the art is completely familiar. It is believed that a detailed description thereof would lead only to prolixity and is thus omitted.

When power fail signal resumes, the enable signal applied from power fail line 62b to an input of an AND gate 76 permits the contents of non-volatile storage 80 to be fed through AND gate 76 for examination in a CPU RAM status verification circuit 82. If the present application of power to electronic remote data recorder 24 is the first time that power has been applied following installation, the pattern of data in non-volatile storage 80 is random, as opposed to the ordered pattern of data existing in storage 80 at all other times. If a disordered pattern of data indicating an initial turn-on is found, CPU RAM status verification circuit 82 applies an enable signal on a line 84 to one input of an AND gate 86. A second input of AND gate 86 receives program data from programming data line 70 which may originate in metering data center 26 (FIG. 1) or may be input from a local programmer. The output of AND gate 86 is applied through an OR gate 88 and line 60c to central processing unit 50. Thus, upon initial startup of electronic remote data recorder 24, programming of central processing unit 50 is enabled.

An inverted output of CPU RAM status verification circuit 82 is applied on a line 90 to a first input of an AND gate 92. The output of AND gate 76 is applied on a line 94 to a second input of AND gate 92. An input on line 60a from central processing unit 50 indicates that an outgoing call is in progress. This indication of an outgoing call is connected directly to one input of an AND gate 96 and, through an inverter 98, to a third input of AND gate 92. The output of AND gate 92 is connected through OR gate 88 to line 60c. The program data on programming data line 70 is also applied to a second input of AND gate 96. The output of AND gate 96 is connected through OR gate 88 to line 60c.

A write-protect switch 100 is a two-position switch having one terminal connected to an enabling voltage +V and its other terminal connected directly to a line 84 and through an inverter 102 to an input of AND gate 92. Write-protect switch 100 is normally in the open condition, thereby permitting control of programming to take place under control of the outputs of CPU RAM status verification circuit 82 and the state of the signal on line 60a. When closed, write-protect switch 100 inhibits AND gate 92 and enables AND gate 86, regardless of the conditions of the outputs of CPU RAM status verification circuit 82. This permits programming remotely over the telephone line or on-site by an authorized person using, for example, a conventional optical interface such as one supplied by the General Electric Company under the trademark Optocom. The program data is applied on programming data line 70 through enabled AND gate 86 and OR gate 88 to line 60c from whence it is applied to central processing unit 50.

The outgoing-call signal on line 60a, which may originate in a MODEM (not shown) or in central processing unit 50, permits programming data from programming data line 70 to be applied to central processing unit 50 even when write-protect switch 100 is in its inhibiting position and the condition is other than an initial startup. This makes electronic remote data recorder 24 programmable during an outgoing call it has, but prevents programming during an incoming call. This offers a layer of security to program data, as detailed in the foregoing general description.

In some installations, it is desirable to permit external programming during more than one post-installation programming session. Such a situation may include an installation procedure in which an installer performs testing using test data connected to power fail detection and recovery unit 56 from a local programming device. Following installation and checkout, it may be desired to apply programming data, either locally, or from metering data center 26, representing the operational programming to be used in the actual collection of metering data. In order to accomplish this, the first time write-protect switch 100 is placed in the closed position, central processing unit 50 recognizes this change in condition by setting a flag. Then, during, for example, the first incoming telephone call subsequent to setting the write-protect switch in the closed position, central processing unit 50 simulates an outgoing call by placing an outgoing-call signal on line 60a. After this second external programming opportunity, central processing unit no longer simulates an incoming call, and thus, the write-protect function goes into operation.

If subsequent unscheduled reprogramming is required in the absence of an outgoing call, write-protect switch may be placed in the open position for a first programming opportunity. This restores the additional programming opportunity in the same manner as described following initial installation. It can be foreseen that some installations may benefit from the availability of a predetermined number of external programming sessions in excess of two. This is readily accomplished by programming central processing unit 50 to permit more than one additional programming session following the first one after write-protect switch is closed.

Referring momentarily to FIG. 3, data storage channels 44, 46 and 48 are identical, thus, the following description of data storage channel 44 will serve as the description for all.

Figure 5:
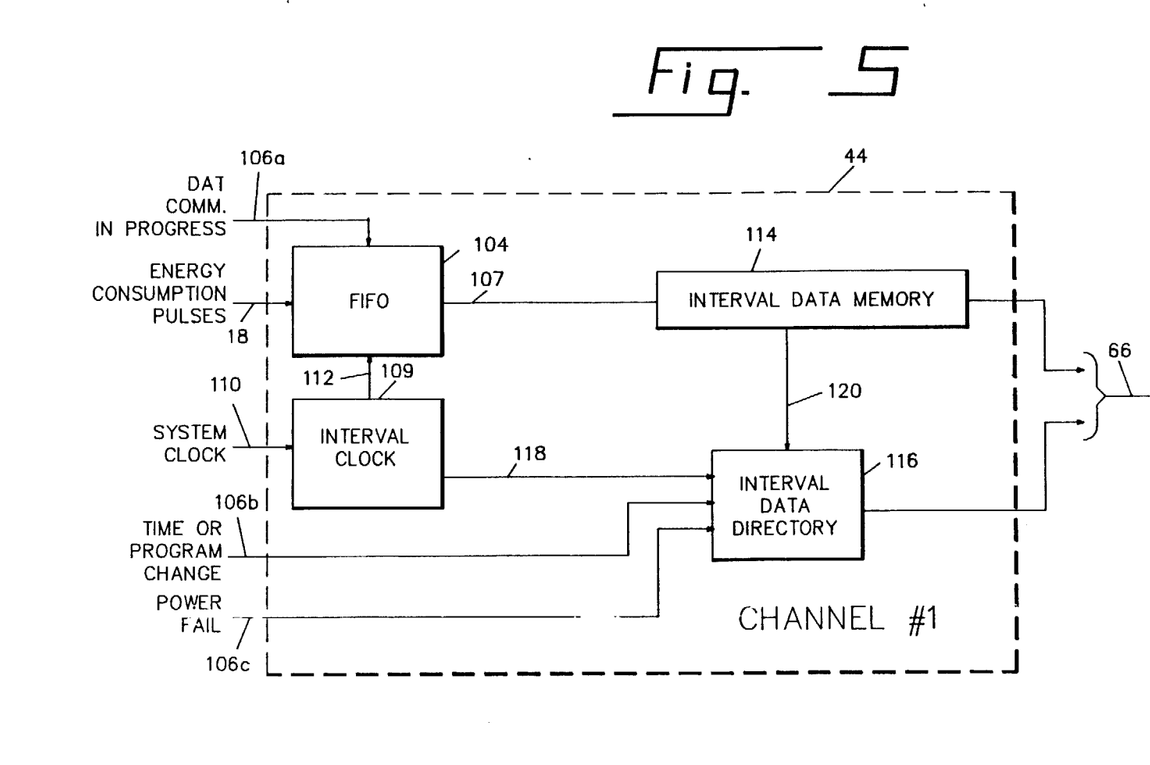
FIG. 5 is a logic diagram of a data storage channel of FIG. 3.

Referring now to FIG. 5, data storage channel 44 includes a first-in first-out memory 104 receiving energy-consumption pulses on line 18 at one of its inputs and a signal on a line 106a indicating that data communication is in progress. An output of first-in first-out memory 104 is applied on a line 107 to one input of an AND gate 108. An interval clock 109 receives system clock signals on a line 110. At regular intervals, interval clock 109 applies an enable signal on a line 112 to a second input of AND gate 108, whereby the contents of first-in first-out memory 104 are passed through AND gate 108 to update the contents of an interval data memory 114. An interval data directory 116 receives a time signal from interval clock 109 on a line 118. In addition, interval data directory 116 receives a signal on a line 106b whenever a time reset or a program change occurs, and a power-fail signal on line 106c indicating that processing of data has been halted because of low voltage. Outputs of interval data memory 114 and interval data directory 116 are applied to output data line 66. A data pointer is applied on a line 120 from interval data memory 114 to interval data directory 116. The data-communication signal on line 106a is also applied to interval data directory 116.

During normal operation, in the absence of data communication, reset or power failure, first-in first-out memory 104 accumulates energy consumption pulses for a continuing sequence of fixed predetermined periods. At the end of each fixed predetermined period, the contents of first-in first-out memory 104 are read out through AND gate 108 and stored as a number in interval data memory 114. The number indicates the total energy consumed in the fixed predetermined period. For compact storage, interval data memory 114 is not required to store contemporary time signals.

Interval data directory 116 stores three numbers each time any of the following events occurs: data readout, time change, program change or power failure. One of the numbers is the time that the event occurs. Another number is a pointer indicating the current storage location being used in interval data memory 114. The third number is a flag indicating the type of event.

In a completely uneventful time between data readouts, interval data directory 116 contains only a single trio of numbers indicating the last time that a readout occurred. Given these numbers, and a date stamp indicating the time at which the readout occurred, all of the consumption data in interval data memory 114 can be related to the times they occurred. Accordingly, the data in interval data memory 114 is available with inferred contemporaneous time data to analyze the load profile for time-of-use and demand billing.

In the case of a power failure, two trios of numbers are stored: the power-failure time and the power-resumption time with their related pointers and flags. For example, if data storage channel 44 employs an interval of 15 minutes and updates interval data memory 114 on one-minute boundaries, a triggering event occurring at two minutes following the beginning of an interval essentially breaks the interval into a two-minute portion and a 13-minute portion. The data pointer, event time and event flag stored in interval data directory 116 permits interpretation of the data in interval data memory 114 without ambiguity.

Referring now to FIG. 6, communications control unit 34 includes an other-phone-detect circuit 122, a telephone line-sharing circuit 124 and a MODEM 126 (modulator-demodulator). MODEM 126 is assumed to be a conventional device, preferably including an ability to answer an incoming call in response to a ringing signal and to initiate a call under control of signals from central processing unit 50. Since it is conventional, further description of MODEM 126 is omitted herefrom.

Figure 7:
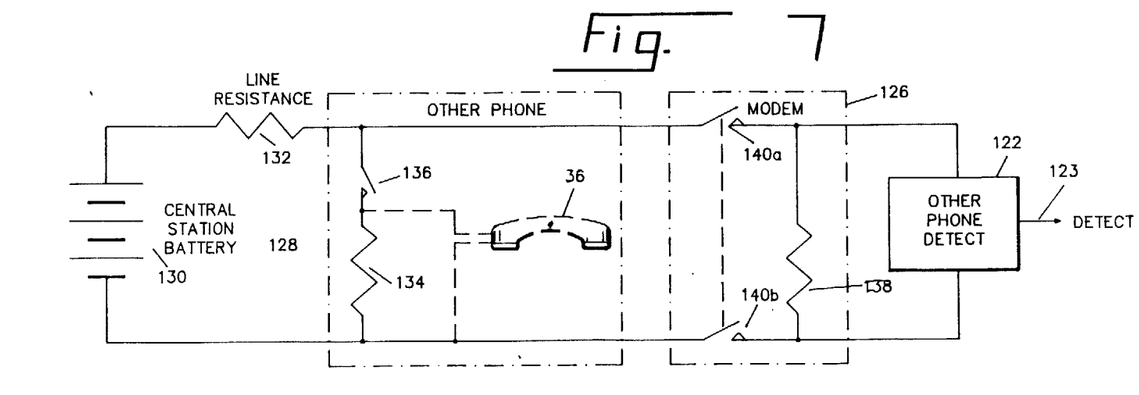
FIG. 7 is a simplified schematic diagram of a telephone system with which an other-phone detector of FIG. 6 is employed.

Referring now to FIG. 7, the problem to be solved by other-phone-detect circuit 122 is illustrated. It is assumed that, in order to be a good neighbor to another user of the telephone line, electronic remote data recorder 24 should relinquish the line so that the other user may use it if the other user indicates a desire to use the telephone line while it is being used by electronic remote data recorder 24 for data transmission. Other-phone-detect circuit 122 is connected across a telephone line 128 in parallel with telephone instrument 36. A telephone system includes a DC power source, here represented by a central station battery 130 having a fixed-voltage of from about 42 to about 56 volts. An equivalent resistor, representing a line resistance 132, is shown in series with one side of telephone line 128 to other-phone-detect circuit 122.

The resistance of line resistance 132 is variable in a given installation about a nominal value which may be from about 400 to about 1700 ohms. For present purposes, telephone instrument 36 is represented by a local load resistance 134. A hook switch 136 responds to removing telephone instrument 36 from its cradle by connecting local load resistance 134 across telephone line 128. An internal resistance of MODEM 126 is represented by a MODEM load resistance 138, which is placed in series with a MODEM hook switch 140.

Several problems must be recognized and overcome before the desire of the other user to use the telephone line can be determined from local load resistance 134 being placed across telephone line 128 by closure of hook switch 136. In particular, it is necessary to recognize the condition produced when local load resistance 134 is placed across telephone line 128 while ignoring external events. External events are characterized either by relatively slow variations caused by fluctuation in central station battery 130 or line resistance 132 or by sharp spikes due, for example, to lightning strikes. An off-hook condition of telephone instrument 36, in contrast, is evidenced by a sharp reduction in voltage across other-phone-detect circuit 122 which thereafter varies slowly about its lower value with possible positive or negative short-duration superimposed spikes.

The magnitude of the slowly varying external variations in source voltage and line resistance are such that a mere measurement of the voltage across telephone line 128 is insufficient to indicate whether or not local load resistance 134 is across telephone line 128 in parallel with MODEM load resistance 138. However, advantage is taken of the different detectable characteristics due to external sources and those due to telephone instrument 36 going off hook.

Figure 8:
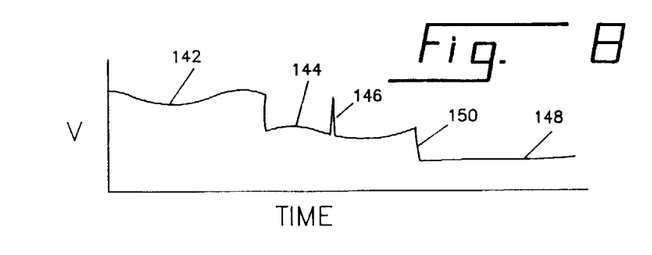
FIG. 8 is a curve showing typical variations in voltage on a typical telephone line, as seen by the other-phone detector of FIG. 7.

Referring to the curve in FIG. 8, three conditions which may be sensed by other-phone-detect circuit 122 are shown. With both telephone instrument 36 and MODEM 126 on hook, a voltage region 142 is seen to be slowly varying and may contain short-duration positive and/or negative voltage spikes (not shown). When MODEM 126 goes off hook, the voltage is reduced as shown at 144. This voltage also includes a slow variation, in addition to which, it may include one or more positive or negative spikes 146. When telephone instrument 36 goes off hook in parallel with MODEM 126, a lower voltage region 148 begins with a sharp transition 150 from the DC level of voltage region 144 to the DC level of voltage region 148. When voltage region 148 is detected by other-phone-detect circuit 122, MODEM 126 relinquishes the line, thereby enabling line use by another user.

In brief, other-phone-detect circuit 122 employs a comparison of a short-term average with a long-term average to detect the transition from voltage region 144 to voltage region 148. When the difference between the short- and long-term averages exceeds a predetermined threshold for a predetermined period of time, a step transition is detected. If the comparison fails, either in magnitude or the duration, detection does not occur. That is, the short-term average may respond to spike 146, but the long-term average does not. The predetermined period of time is selected so that a transient event such as spike 146 passes, and the short-term average returns to agreement with the long-term average, before the end of the time period. This protects other-phone-detect circuit 122 from responding to transient events. Also, if sharp transition 150 is too shallow to indicate that telephone instrument 36 has gone off hook, an insufficient difference between the averages prevents triggering other-phone-detect circuit 122. Both the short-term and the long-term averages follow the normal slow variation in line voltage and thus avoid triggering on this type of change.

Figure 9:
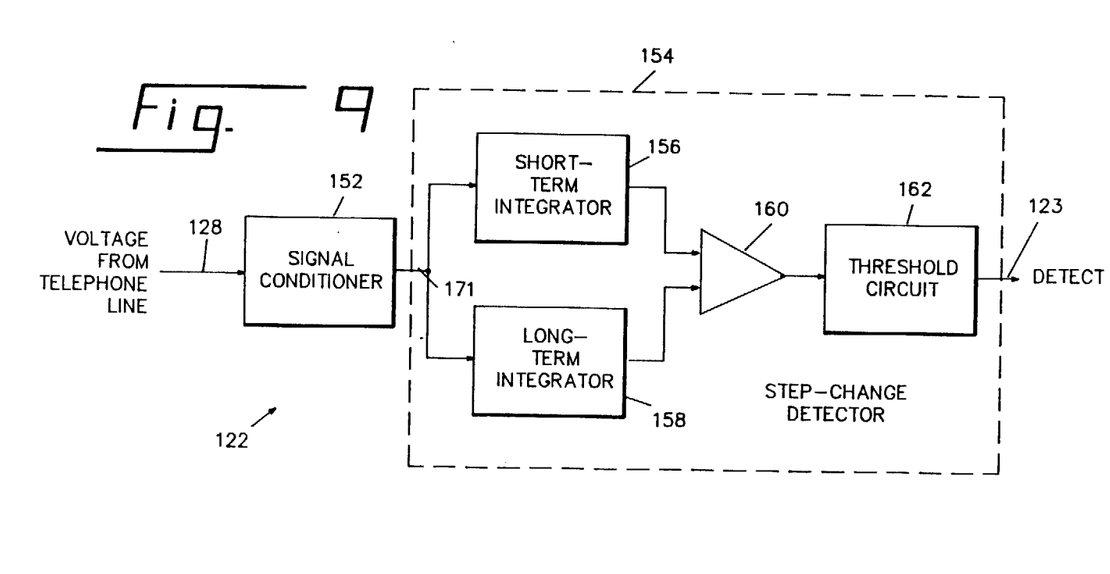
FIG. 9 is a block diagram of the other-phone detector of FIG. 7.

Referring to FIG. 9, other-phone-detect circuit 122 consists of a signal-conditioner circuit 152 receiving the telephone line voltage on telephone line 128, and a step-change detector 154. The output of signal-conditioner circuit 152 is applied on a line 171 in parallel to inputs of a long-term integrator 158. The outputs of short-term integrator 156 and long-term integrator 158 are applied to inputs of a differential amplifier 160. The output of differential amplifier 160 is applied to the input of a threshold circuit 162. When threshold circuit 162 receives a predetermined difference signal lasting for at least a predetermined period of time, it produces an other-phone-detect signal to cause MODEM 126 (FIG. 7) to go off line.

The apparatus in FIG. 9 can be realized with any convenient technology. In particular, one skilled in the art would recognize that such apparatus could be implemented in analog or digital form without departing from the spirit and scope of the invention. For concreteness, an embodiment of the invention is described in the following paragraphs using digital techniques for implementing step-change detector 154.

Figure 10:
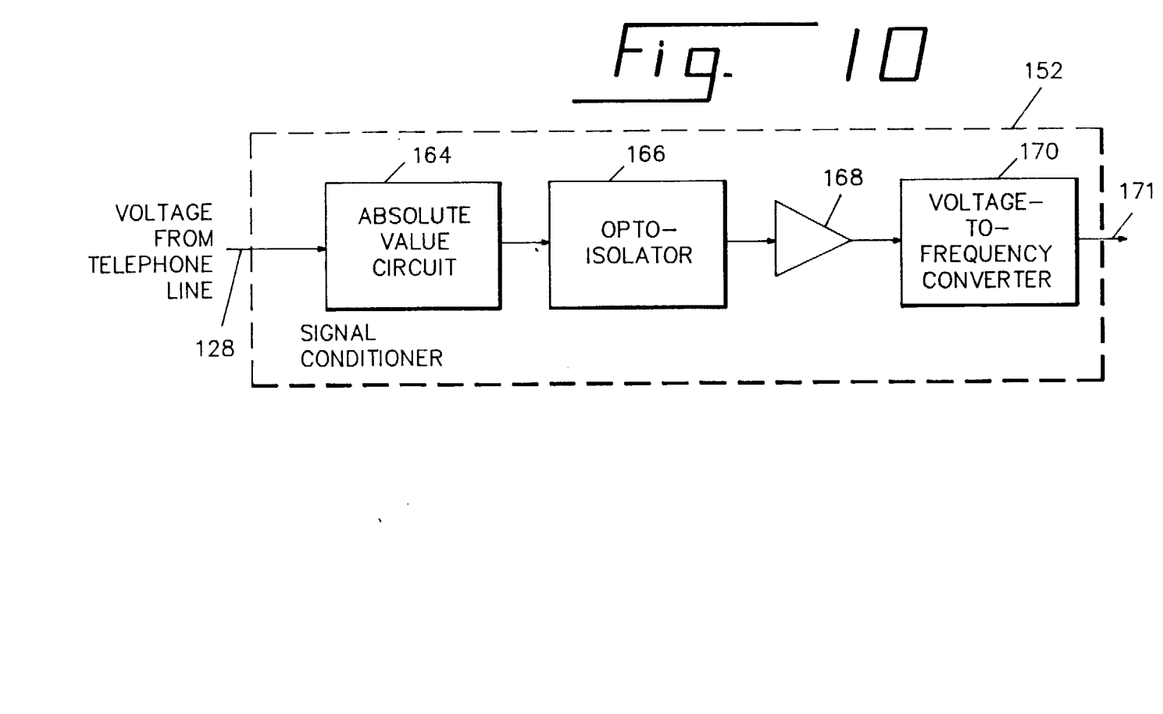
FIG. 10 is a block diagram of the signal conditioner of FIG. 9

Referring now to FIG. 10, signal-conditioner circuit 152 includes an absolute value circuit 164 receiving the telephone line voltage of either positive or negative polarity and producing a unipolar output voltage having an amplitude corresponding to that of the telephone line voltage. One convenient implementation of absolute value circuit 164 includes a conventional full-wave bridge rectifier circuit. The unipolar output of absolute value circuit 164 is applied to an opto-isolator 166 which prevents large voltage transients on telephone line 128 from affecting succeeding circuits. The output of opto-isolator 166 passes through a conventional level shifter 168 which adjusts the amplitude limits of the output of level shifter 168 before application to a voltage-to-frequency converter 170.

Voltage-to-frequency converter 170 produces a square-wave output signal having a frequency related to the voltage applied to its input. The relationship may be positive or negative. In a preferred embodiment, the output frequency of voltage-to-frequency converter 170 increases with increasing voltage. Stated another way, the period of the output pulses from voltage-to-frequency converter 170 decreases with increasing voltage input. Voltage-to-frequency converter 170 may be a conventional timer such as, for example, a 555 timer, with suitable external components. In the preferred embodiment, voltage-to-frequency converter 170 is a pulse-generating circuit capable of producing a square-wave output having about a 50 percent duty ratio over the entire frequency range.

Returning now to FIG. 9, the functions performed by step-change detector 154 are done in a digital processor and, most preferably, in a microprocessor. The periods of the pulses from signal-conditioner circuit 152 may be measured in the processor by conventional means and the short-term and long-term averages logically illustrated as short-term integrator 156 and long-term integrator 158 can be derived from the measured periods using conventional arithmetic techniques. A running difference between the two averages, logically illustrated by differential amplifier 160, may also be taken by subtraction in the processor. Finally, the thresholding and delay functions logically, illustrated by threshold circuit 162, can also be performed in the processor.

The presence of absolute value circuit 164 makes signal-conditioner circuit 152 and step-change detector 154 indifferent to the polarity of a step change or a transient. When a telephone call is being dialled by electronic remote data recorder 24, other-phone-detect circuit 122 continues to monitor the voltages on telephone line 128. If, during such dialling, another telephone instrument 36 should go off hook, it is likely that a person listening on such an instrument would hear the dialling tones and would place that instrument on hook. As a good neighbor, it is desirable that, sensing that another user is attempting to place a telephone call, electronic remote data recorder 24 should go on hook. Due to the presence of absolute value circuit 164, a sharp voltage transition produced by the other telephone going on hook, opposite in polarity to that shown in FIG. 8, is detected in the same manner described for another telephone going off hook during the body of a telephone session Thus, other-phone-detect circuit 122 produces a detect signal on line 123 causing electronic remote data recorder 24 to go on hook, thereby permitting the other user to proceed with its intended call.

Figure 11:
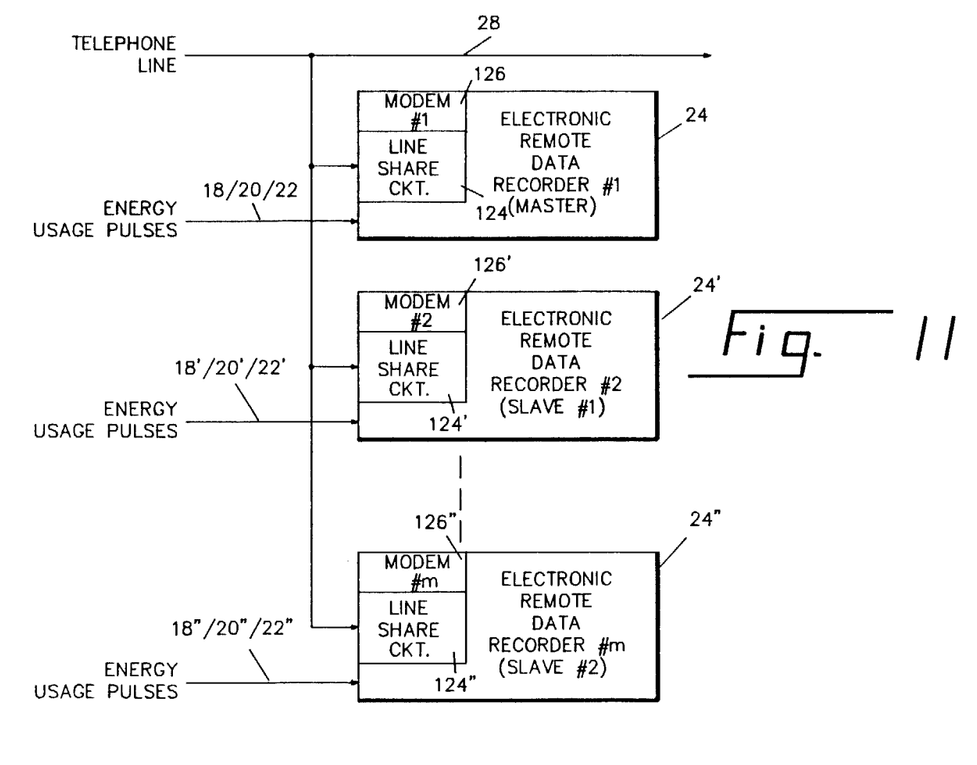
FIG. 11 is a simplified block global diagram of a plurality of electronic remote data recorders including means for all recorders to be polled on a common telephone line without mutual interference.

Referring now to FIG. 11, telephone line-sharing circuit 124 is an optional feature permitting a plurality of electronic remote data recorders 24, 24' and 24" to be polled using a single shared telephone line without interfering with each other. One of electronic remote data recorders 24, 24' and 24" is considered a master and the remainder, slaves. For present purposes, electronic remote data recorder 24 is considered to be the master, and electronic remote data recorders 24' and 24" the slaves. Outgoing calls may be initiated by any telephone line-sharing circuit 124. For incoming calls, each telephone line-sharing circuit 124 responds to a unique code on telephone line 28 by turning on its transmitting carrier, whereby communications are initiated by placing the MODEM carrier on the line. It also responds to reception of a unique code of any of the other telephone line-sharing circuits 124, not its own, by turning off its carrier A carrier is required from a MODEM before communications can be established. Upon the occurrence of an incoming call, master telephone line-sharing circuit 124 triggers its MODEM 126 to produce an answer carrier and to maintain it at least until communications are established. If the incoming call addresses master electronic remote data recorder 24, then communications can proceed without further protocol, other than the normal security codes. Telephone line-sharing circuits 124' and 124" monitor telephone line 28, listening for their unique identification codes. If the incoming call is addressed to an electronic remote data recorder other than master electronic remote data recorder 24, once communications are established with MODEM 126, as noted above, the incoming call contains the unique code of the electronic remote data recorder being called. Master telephone line-sharing circuit 124, hearing an identity code other than its own, triggers MODEM 126 to turn off its carrier. The slave telephone line-sharing circuit, hearing its own identity code, triggers its MODEM to turn on its answer carrier. The transition between the master and slave carriers is fast enough to permit the calling MODEM (not shown) to ignore any small gap in answer carrier which may occur during the changeover.

The foregoing description has employed logical elements such as, for example, gates, comparators and threshold circuits, to illustrate the functions performed by the apparatus of the invention. It would be clear to one skilled in the art that substantially all of the described function may be performed by a suitable digital processor and such an embodiment is fully encompassed within the scope of the invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A power fail detector and recovery apparatus for an electronic remote data recorder, said electronic remote data recorder including a processor therein, comprising:

means for producing a power failure signal in response to a first predetermined voltage reduction in a power source to said electronic remote data recorder;

said electronic remote data recorder being responsive to said power fail signal by halting operation of said processor;

a non-volatile storage device for storing contents of said processor in said non-volatile storage upon occurrence of said power fail signal;

means for restoring operation of said processor upon a second predetermined voltage increase in said power source above said first predetermined voltage;

said means for restoring including means for comparing a pattern of said contents in said non-volatile storage with a predetermined data pattern indicating a programmed electronic remote data recorder, and for producing an enable signal when a pattern of said contents indicates that said processor has not been previously programmed; and means responsive to said enable signal for connecting programming data from an external source to said processor for initial programming thereof.

2. Apparatus according to claim 1, further comprising:

a write-protect switch having first and second positions;

means responsive to said write-protect switch being in said first position for preventing programming of said processor from an external source; and means responsive to said write-protect switch being in said second position for permitting programming of said processor from an external source.

3. Apparatus according to claim 2, wherein said means responsive to said write-protect switch being in said first position further includes means for connecting programming data from an external source to said processor for a predetermined number of times following placing said write-protect switch in said first position.

4. Apparatus according to claim 3, wherein said predetermined number of times is two times 5. Apparatus according to claim 1, further comprising means for permitting connection of programming data to said processor from a telephone line when a telephone call is initiated by said electronic remote data recorder.

* * * * *